United States Patent
Huang

(10) Patent No.: US 12,382,700 B2
(45) Date of Patent: Aug. 5, 2025

(54) SEMICONDUCTOR DEVICE AND MANUFACTURING METHOD THEREOF

(71) Applicant: AUO Corporation, Hsinchu (TW)

(72) Inventor: Chen-Shuo Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 513 days.

(21) Appl. No.: 17/993,898

(22) Filed: Nov. 24, 2022

(65) Prior Publication Data

US 2023/0187513 A1    Jun. 15, 2023

Related U.S. Application Data

(60) Provisional application No. 63/287,695, filed on Dec. 9, 2021.

(30) Foreign Application Priority Data

Jun. 2, 2022  (TW) .................................. 111120547

(51) Int. Cl.
*H10D 64/27* (2025.01)
*H10D 30/67* (2025.01)
*H10D 64/01* (2025.01)

(52) U.S. Cl.
CPC ....... *H10D 64/516* (2025.01); *H10D 30/6733* (2025.01); *H10D 30/6755* (2025.01); *H10D 64/01* (2025.01)

(58) Field of Classification Search
None
See application file for complete search history.

(56) References Cited

U.S. PATENT DOCUMENTS

| | | |
|---|---|---|
| 5,371,026 A | 12/1994 | Hayden et al. |
| 8,049,225 B2 | 11/2011 | Yamazaki et al. |
| 8,785,242 B2 | 7/2014 | Yamazaki et al. |
| 9,105,659 B2 | 8/2015 | Yamazaki et al. |
| 10,276,594 B2 | 4/2019 | Yamazaki et al. |
| 2010/0032665 A1 | 2/2010 | Yamazaki et al. |
| 2011/0318875 A1 | 12/2011 | Yamazaki et al. |

(Continued)

FOREIGN PATENT DOCUMENTS

| | | |
|---|---|---|
| CN | 101645462 | 2/2010 |
| CN | 103346093 | 10/2013 |

(Continued)

*Primary Examiner* — Kyoung Lee
(74) *Attorney, Agent, or Firm* — JCIPRNET

(57) ABSTRACT

A semiconductor device and a manufacturing method of the semiconductor device are provided. The semiconductor device includes a substrate, a semiconductor structure, a gate dielectric layer, and a first gate. The semiconductor structure is disposed above the substrate and includes two thick portions and a thin portion located between the two thick portions. A thickness of the two thick portions is larger than a thickness of the thin portion. The gate dielectric layer is disposed on the semiconductor structure. The first gate is disposed on the gate dielectric layer. A width of the first gate is smaller or equal to a width of the thin portion, and the first gate is overlapped with the thin portion in a normal direction of a top surface of the substrate. A doping concentration of the two portions is larger than a doping concentration of the thin portion.

16 Claims, 13 Drawing Sheets

(56) References Cited

U.S. PATENT DOCUMENTS

| | | | |
|---|---|---|---|
| 2013/0082312 A1* | 4/2013 | Hung | H10D 30/60 |
| | | | 257/E21.546 |
| 2014/0329365 A1 | 11/2014 | Yamazaki et al. | |
| 2018/0076231 A1 | 3/2018 | Yamazaki et al. | |

FOREIGN PATENT DOCUMENTS

| | | |
|---|---|---|
| CN | 107093557 | 8/2017 |
| CN | 109643735 | 4/2019 |
| CN | 110459587 | 11/2019 |

\* cited by examiner

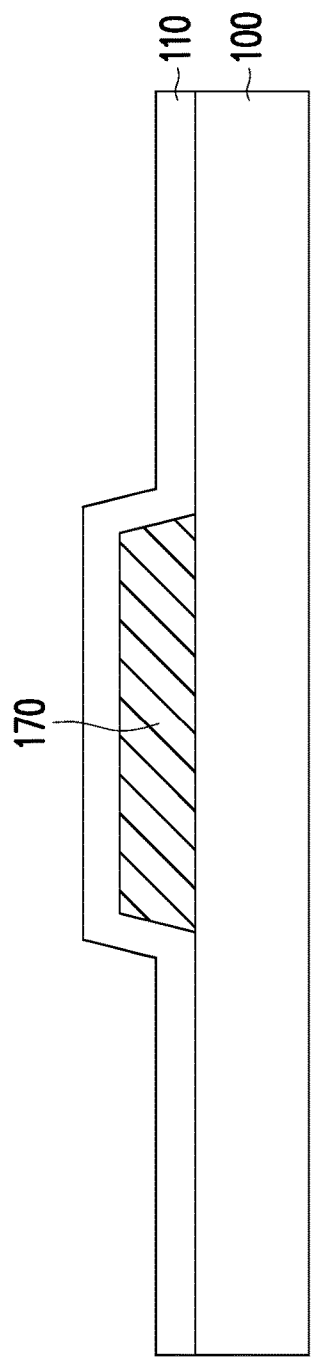
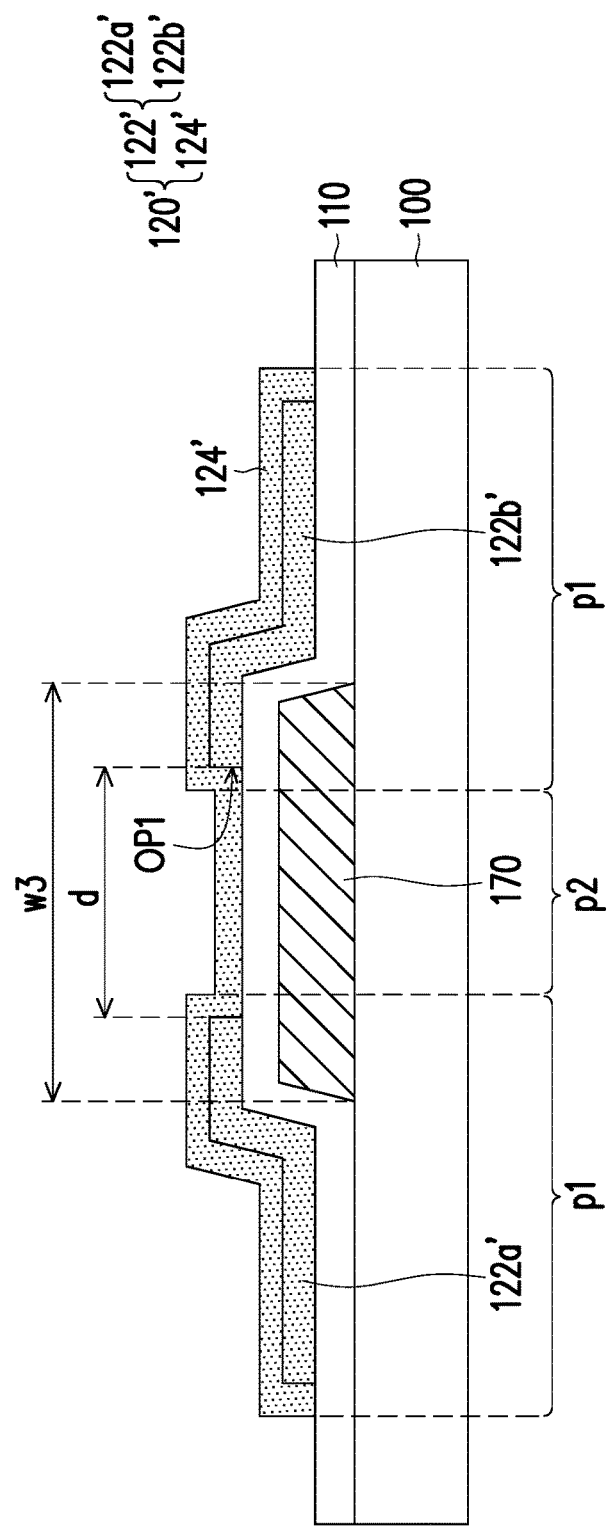
FIG. 6A
FIG. 6B

SEMICONDUCTOR DEVICE AND MANUFACTURING METHOD THEREOF

CROSS-REFERENCE TO RELATED APPLICATION

This application claims the priority benefit of U.S. provisional application Ser. No. 63/287,695, filed on Dec. 9, 2021 and Taiwan patent application serial no. 111120547, filed on Jun. 2, 2022. The entirety of each of the above-mentioned patent applications is hereby incorporated by reference herein and made a part of this specification.

BACKGROUND

Technical Field

The disclosure relates to a semiconductor device and a manufacturing method thereof; more particularly, the disclosure relates to a semiconductor device having metal oxide and a manufacturing method thereof.

Description of Related Art

At present, well-known thin film transistors (TFTs) often apply amorphous silicon semiconductors as channels, and the amorphous silicon semiconductors have been widely used in various TFTs due to their simple manufacturing process and low cost.

With the advancement of display technologies, a resolution of a display panel gradually increases year by year. In order to reduce the size of the TFTs in pixel circuits, many manufacturers endeavor to develop new semiconductor materials, such as metal oxide semiconductor materials which have the advantage of high electron mobility and are conducive to reduction of the size of semiconductor devices. However, if a voltage threshold of the semiconductor device is excessively low, a current leakage issue may occur in the semiconductor device. To increase the threshold voltage of the semiconductor device, a thickness of a metal oxide semiconductor layer in the semiconductor device is often reduced. However, the reduction of the thickness of the metal oxide semiconductor layer leads to an increase in a resistivity of a doped region where a source and a drain are in contact and a decrease in an operating current.

SUMMARY

The disclosure provides a semiconductor device which may have favorable operating electrical properties and an improved threshold voltage and a manufacturing method of the semiconductor device, so as to improve the overall performance and reliability of the semiconductor device.

In an embodiment of the disclosure, a semiconductor device that includes a substrate, a semiconductor structure, a gate dielectric layer, and a first gate is provided. The semiconductor structure is disposed above the substrate and includes two thick portions and a thin portion located between the two thick portions, where a thickness of the two thick portions is larger than a thickness of the thin portion. The gate dielectric layer is disposed on the semiconductor structure. The first gate is disposed on the gate dielectric layer. A width of the first gate is smaller than or equal to a width of the thin portion, and the first gate is overlapped with the thin portion in a normal direction of a top surface of the substrate. A doping concentration of the two thick portions is higher than a doping concentration of at least a part of the thin portion.

In an embodiment of the disclosure, a manufacturing method of a semiconductor device includes following steps. A substrate is provided. A semiconductor structure is formed above the substrate, where the semiconductor structure includes two thick portions and a thin portion located between the two thick portions, and a thickness of the two thick portions is larger than a thickness of the thin portion. A gate dielectric layer is formed on the semiconductor structure. A first gate is formed on the gate dielectric layer, where a width of the first gate is smaller than or equal to a width of the thin portion, and the first gate is overlapped with the thin portion in a normal direction of a top surface of the substrate. A doping process is performed on the semiconductor structure by applying the first gate as a mask, so that a doping concentration of the two thick portions is higher than a doping concentration of at least a part of the thin portion.

In an embodiment of the disclosure, a semiconductor device that includes a substrate, a semiconductor structure, a gate dielectric layer, and a first gate is provided. The semiconductor structure is disposed above the substrate and includes two thick portions and a thin portion located between the two thick portions, where a thickness of the two thick portions is larger than a thickness of the thin portion. The gate dielectric layer is disposed on the semiconductor structure. The first gate is disposed on the gate dielectric layer. A width of the first gate is smaller than or equal to a width of the thin portion, and the first gate is overlapped with the thin portion in a normal direction of a top surface of the substrate. An oxygen concentration of the two thick portions is lower than an oxygen concentration of at least a part of the thin portion.

In an embodiment of the disclosure, a semiconductor device that includes a substrate, a semiconductor structure, a gate dielectric layer, and a first gate is provided. The semiconductor structure is disposed above the substrate and includes two thick portions and a thin portion located between the two thick portions, where a thickness of the two thick portions is larger than a thickness of the thin portion. The gate dielectric layer is disposed on the semiconductor structure. The first gate is disposed on the gate dielectric layer. A width of the first gate is smaller than or equal to a width of the thin portion, and the first gate is overlapped with the thin portion in a normal direction of a top surface of the substrate. An equivalent resistivity of the two thick portions is smaller than an equivalent resistivity of at least a part of the thin portion.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 6A to FIG. 6C are schematic cross-sectional flowcharts of a manufacturing process according to the embodiment depicted in FIG. 5.

DESCRIPTION OF THE EMBODIMENTS

Figure 1:
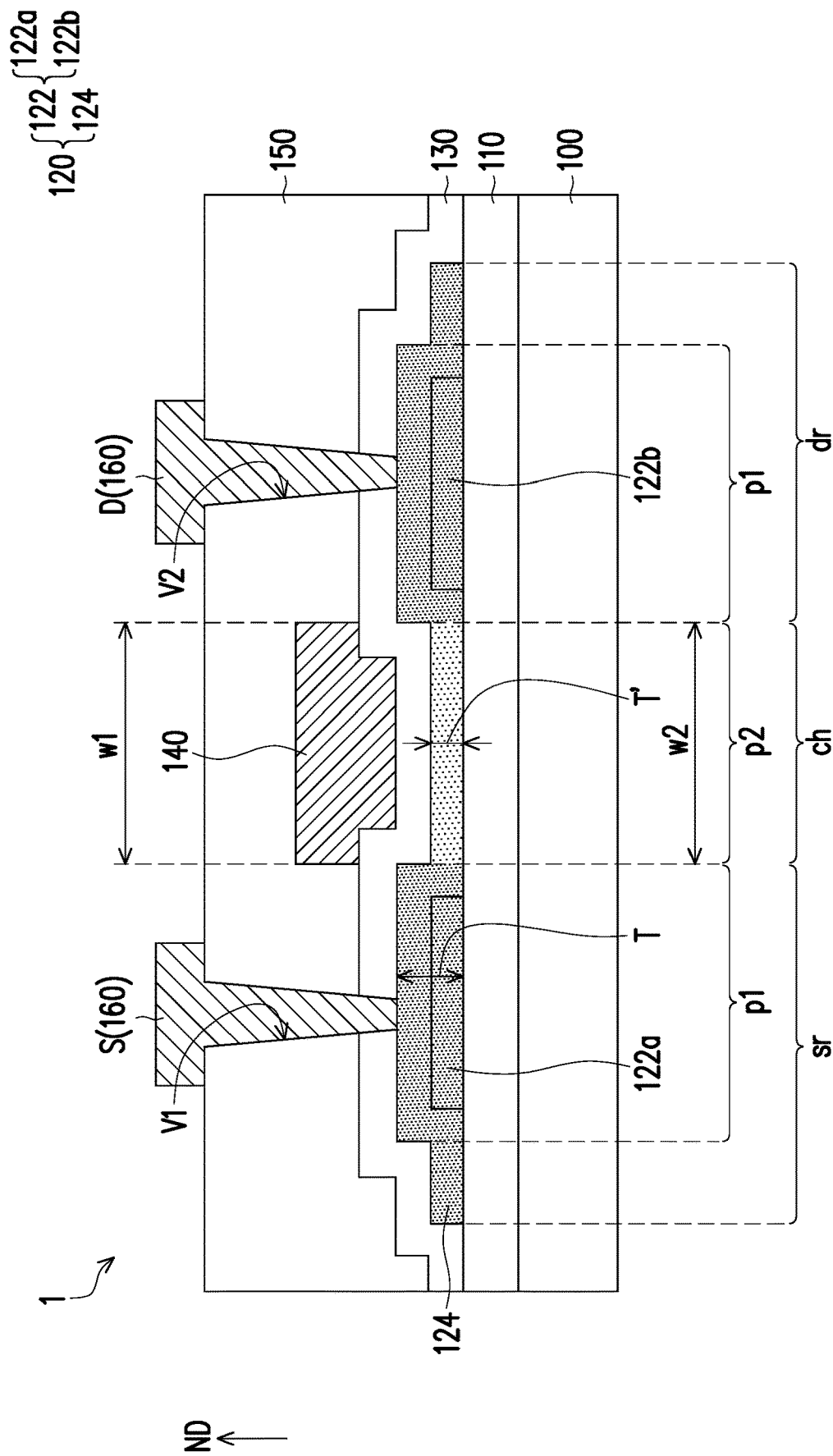
FIG. 1 is a schematic cross-sectional view of a semiconductor device according to an embodiment of the disclosure.

Reference is now made in detail to exemplary embodiments of the disclosure, and examples of the exemplary embodiments are described in the accompanying drawings. Whenever possible, the same reference numbers are used in the drawings and descriptions to indicate the same or similar parts.

FIG. 1 is a schematic cross-sectional view of a semiconductor device according to an embodiment of the disclosure.

With reference to FIG. 1, a semiconductor device 1 includes a substrate 100, a semiconductor structure 120, a gate dielectric layer 130, and a first gate 140. In this embodiment, the semiconductor device 1 further includes a buffer layer 110, an interlayer dielectric layer 150, and a conductive layer 160.

A material of the substrate 100 may include glass, quartz, organic polymer, or an opaque/reflective material (e.g., a conductive material, metal, wafer, ceramics, or other applicable materials), or other applicable materials. If the conductive material or the metal is used, the substrate 100 is covered by an insulation layer (not shown) to prevent short circuits. In some embodiments, the substrate 100 is a flexible substrate, and the material of the substrate 100 is, for instance, polyethylene terephthalate (PET), polyethylene naphthalate (PEN), polyester (PES), polymethylmethacrylate (PMMA), polycarbonate (PC), polyimide (PI), metal foil, or other flexible materials. The buffer layer 110 is located on the substrate 100, and a material of the buffer layer 110 may include silicon nitride, silicon oxide, silicon nitride oxide (SiNO), other appropriate materials, or a stacked layer containing said materials, which should however not be construed as a limitation in the disclosure.

The semiconductor structure 120 is disposed above the substrate 100 and the buffer layer 110. The semiconductor structure 120 includes two thick portions p1 and a thin portion p2 located between the two thick portions p1. A thickness T of the two thick portions p1 is larger than a thickness T' of the thin portion p2. In some embodiments, an outer side of the thick portions p1 may also include the thin portion, so that each of the thick portions p1 is sandwiched by two thin portions. The semiconductor structure 120 may include a first metal oxide semiconductor layer 122 and a second metal oxide semiconductor layer 124, and the first metal oxide semiconductor layer 122 is located between the substrate 100 and the second metal oxide semiconductor layer 124. The first and second metal oxide semiconductor layers 122 and 124 are stacked, and the stacked part of the first and second metal oxide semiconductor layers 122 and 124 may constitute the two thick portions p1 of the semiconductor structure 120. For instance, in this embodiment, the first metal oxide semiconductor layer 122 includes a first island structure 122a and a second island structure 122b separated from each other. The first island structure 122a and the second metal oxide semiconductor layer 124 are stacked to constitute one of the two thick portions p1, and the second island structure 122b and the second metal oxide semiconductor layer 124 are stacked to constitute the other of the two thick portions p1. A part of the second metal oxide semiconductor layer 124 located between the two thick portions p1 may constitute the thin portion p2. Namely, the sum of the thickness T of the two thick portions p1 is substantially the sum of a thickness of the first metal oxide semiconductor layer 122 and a thickness of the second metal oxide semiconductor layer 124. The thickness T' of the thin portion p2 is substantially equal to the thickness of the second metal oxide semiconductor layer 124. In some embodiments, a part of the second metal oxide semiconductor layer 124 located on an outer side of the two thick portions p1 may also constitute the thin portion. A material of the semiconductor structure 120 may include quaternary metal compounds, such as indium gallium zinc oxide (IGZO), indium tin zinc oxide (ITZO), aluminum zinc tin oxide (AZTO), indium tungsten zinc oxide (IWZO), and so forth, or may include oxides composed of any three of the following ternary metals: gallium (Ga), zinc (Zn), indium (In), tin (Sn), aluminum (Al), and tungsten (W). In some embodiments, the first metal oxide semiconductor layer 122 and the second metal oxide semiconductor layer 124 may include identical metal elements, which should however not be construed as a limitation in the disclosure. In some embodiments, the thickness of the first metal oxide semiconductor layer 122 and the thickness of the second metal oxide semiconductor layer 124 may be the same, e.g., both within a range from 2 nm to 60 nm, which should however not be construed as a limitation in the disclosure.

In some embodiments, an equivalent resistivity of the two thick portions p1 is smaller than an equivalent resistivity of the thin portion p2. For instance, the equivalent resistivity of the two thick portions p1 may be within a range from $2\times10^{-7}$ to $2\times10^{-6}$ ohm·cm, and the equivalent resistivity of the thin portion p2 may be within a range from $2\times10^{-6}$ to $1\times10^{-4}$ ohm·cm. In some embodiments, an oxygen concentration of the two thick portions p1 is lower than an oxygen concentration of the thin portion p2, so as to ensure that the equivalent resistivity of the two thick portions p1 is smaller than the equivalent resistivity of the thin portion p2.

The gate dielectric layer 130 is disposed on the semiconductor structure 120 and the buffer layer 110, and the first gate 140 is disposed on the gate dielectric layer 130. In this embodiment, a width w1 the first gate 140 is equal to a width w2 of the thin portion p2, and the first gate 140 is overlapped with the thin portion p2 in a normal direction ND of a top surface of the substrate 100 but is not overlapped with the two thick portions p1. That is, a channel region ch of the semiconductor structure 120 is located at the thin portion p2 between the two thick portions p1, and a source region sr and a drain region dr of the semiconductor structure 120 include the two thick portions p1 and a thin portion located on an outer side of the two thick portions p1, where a doping concentration of the source region sr and the drain region dr may be higher than a doping concentration of the channel region ch. Namely, a doping concentration of the two thick portions p1 is higher than a doping concentration of the thin portion p2. In some embodiments, the doping concentration of the two thick portions p1 is a uniform doping concentration.

In other embodiments, the width w1 the first gate 140 is smaller than the width w2 of the thin portion p2, and one part of the thin portion p2 between the two thick portions p1 is not overlapped with the first gate 140 in the normal direction ND. As such, the source region sr and the drain region dr of the semiconductor structure 120 not only include the two thick portions p1 and the thin portion located on the outer side of the two thick portions p1 but also include the one part of the thin portion p2 that is not overlapped with the first gate 140 and is located between the two thick portions p1. The doping concentration of the two thick portions p1 is higher than a doping concentration of the other part of the thin portion p2 overlapped with the first gate 140.

In some embodiments, the larger the thickness of the semiconductor structure 120, the smaller the equivalent resistivity of the semiconductor structure 120; by contrast, the smaller the thickness of the semiconductor structure 120, the larger the equivalent resistivity of the semiconductor structure 120. In this embodiment, the equivalent resistivity of the thick portions p1 is reduced not only by performing a doping process but also by increasing the thickness of the thick portions p1, so that the equivalent resistivity of the thick portions p1 is smaller than the equivalent resistivity of the thin portion p2. Namely, the resistivity of the source region sr and the drain region dr is smaller than the resistivity of the channel region ch.

The interlayer dielectric layer 150 is disposed on the gate dielectric layer 130 and covers the first gate 140. A material of the interlayer dielectric layer 150 and the gate dielectric layer 130 includes, for instance, silicon oxide, silicon nitride, SiNO, or other appropriate materials. Through holes V1 and V2 penetrate the interlayer dielectric layer 150 and the gate dielectric layer 130, and the through holes V1 and V2 are respectively overlapped with the two thick portions p1. The conductive layer 160 is located on the interlayer dielectric layer 150 and respectively fills the through holes V1 and V2, so as to be electrically connected to the two thick portions p1 of the semiconductor structure 120. The conductive layer 160 may constitute a source S and a drain D, the source S is electrically connected to the source region sr through the through hole V1, and the drain D is electrically connected to the drain region dr through the through hole V2. In some embodiments, a projection area of the two thick portions p1 on the substrate 100 is larger than a contact area between the source S and the drain D and the two thick portions p1, so as to reduce the probability of the source S and the drain D not contacting the thick portions p1 due to process shift.

In view of the above, the threshold voltage of the semiconductor device 1 may be improved; moreover, an interface resistance between the source S and the source region sr and an interface resistance between the drain D and the drain region dr may be reduced, thereby increasing an operating current of the semiconductor device 1 and further improve the overall performance and reliability of the semiconductor device 1.

FIG. 2A to FIG. 2D are schematic cross-sectional flowcharts of a manufacturing process according to the embodiment depicted in FIG. 1.

Figure 2A:
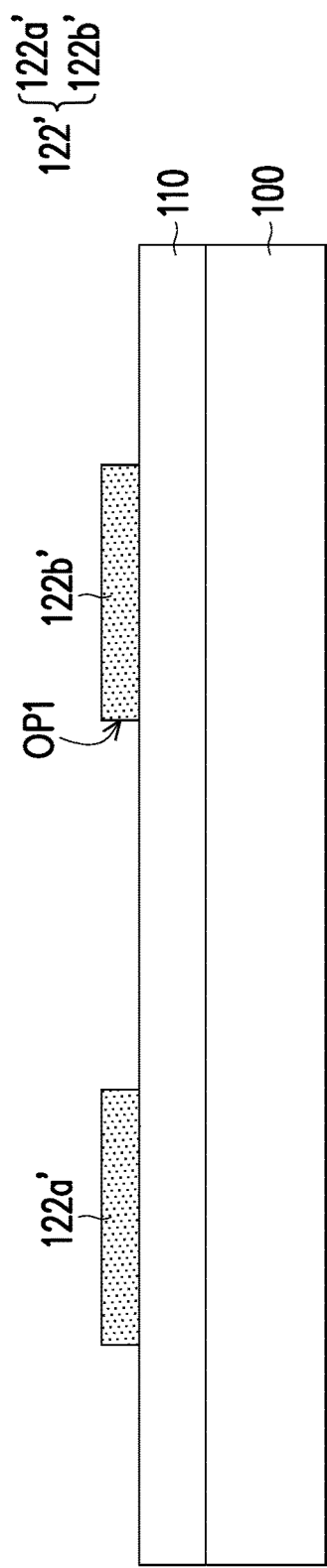
FIG. 2A to FIG. 2D are schematic cross-sectional flowcharts of a manufacturing process according to the embodiment depicted in FIG. 1.
Figure 2B:
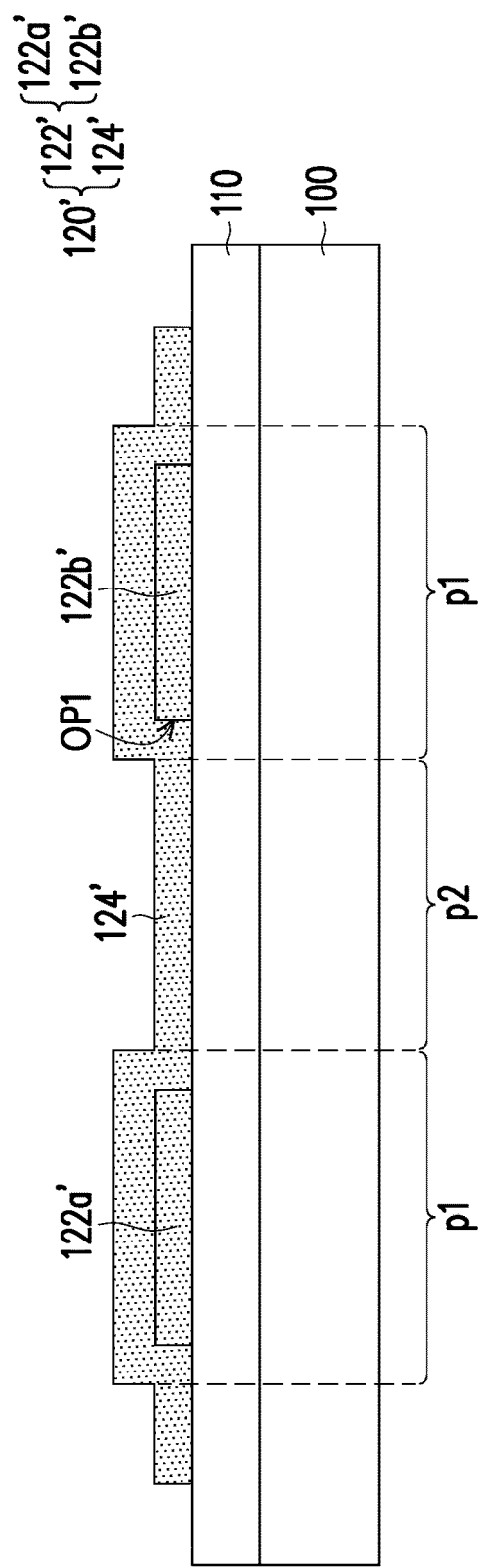

With reference to FIGS. 2A and 2B, a substrate 100 is provided, and a semiconductor structure 120' is formed above the substrate 100. For instance, a buffer layer 110 may be formed on the substrate 100 first, and the semiconductor structure 120' is formed on the buffer layer 110. A method of forming the semiconductor structure 120' may, for instance, include forming a first metal oxide semiconductor layer 122' on the buffer layer 110 and above the substrate 100, as shown in FIG. 2A, where the first metal oxide semiconductor layer 122' has a first opening OP1, so that the first metal oxide semiconductor layer 122' includes a first island structure 122a' and a second island structure 122b' separated from each other. After that, as shown in FIG. 2B, a second metal oxide semiconductor layer 124' is formed on the first metal oxide semiconductor layer 122' and fills the first opening OP1. Thereby, one part of the second metal oxide semiconductor layer 124' between the first island structure 122a' and the second island structure 122b' may constitute the thin portion p2 of the semiconductor structure 120, the first island structure 122a' and another part of the second metal oxide semiconductor layer 124' covering the first island structure 122a' may constitute one of the two thick portions p1 of the semiconductor structure 120, and the second island structure 122b' and the other part of the second metal oxide semiconductor layer 124' covering the second island structure 122b' may constitute the other of the two thick portions p1 of the semiconductor structure 120. In the present embodiment, the second metal oxide semiconductor layer 124' on an outer side of the thick portions p1 may also constitute the thin portion p2.

Figure 2C:
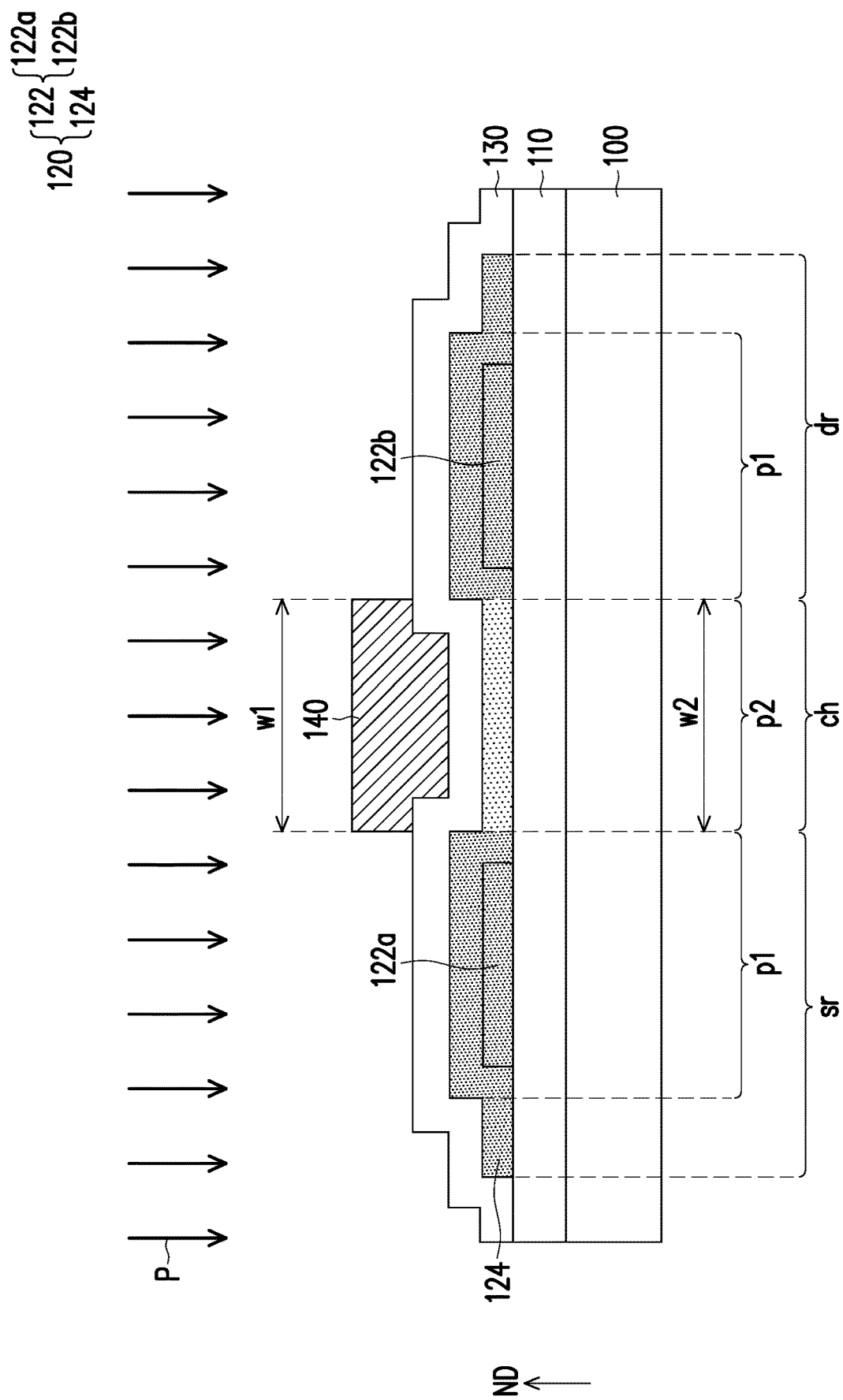

With reference to FIG. 2C, a gate dielectric layer 130 is formed on the semiconductor structure 120'. The gate dielectric layer 130 may cover a top surface and sidewalls of the semiconductor structure 120. A first gate 140 is formed on the gate dielectric layer 130. A method of forming the first gate 140 may, for instance, include depositing a gate material layer (not shown) on the gate dielectric layer 130 and performing an etching process to form the first gate 140. A width w1 of the first gate 140 is substantially smaller than or equal to a width w2 of the thin portion p2 between the two thick portions p1, and the first gate 140 may be overlapped with the thin portion p2 between the two thick portions p1 in a normal direction ND of a top surface of the substrate 100.

As shown in FIG. 2C, a doping process P is performed on the semiconductor structure 120' by applying the first gate 140 as a mask, so as to form the semiconductor structure 120 including a channel region ch, a source region sr, and a drain region dr, and a doping concentration of the two thick portions p1 is higher than a doping concentration of at least a part of the thin portion p2 between the two thick portions p1. The doping process P may refer to a hydrogen plasma process, for instance, which should however not be construed as a limitation in the disclosure. In this embodiment, the first gate 140 is aligned to the thin portion p2, and therefore the channel region ch includes the entire thin portion p2 between the two thick portions p1. In other embodiments, the width w1 of the first gate 140 is smaller than the width w2 of the thin portion p2 between the two thick portions p1, and therefore the source region sr and the drain region dr extend from the thick portions p1 to the thin portion p2 between the two thick portions p1. As such, the source region sr and the drain region dr include a part of the thin portion p2 between the two thick portions p1.

Figure 2D:
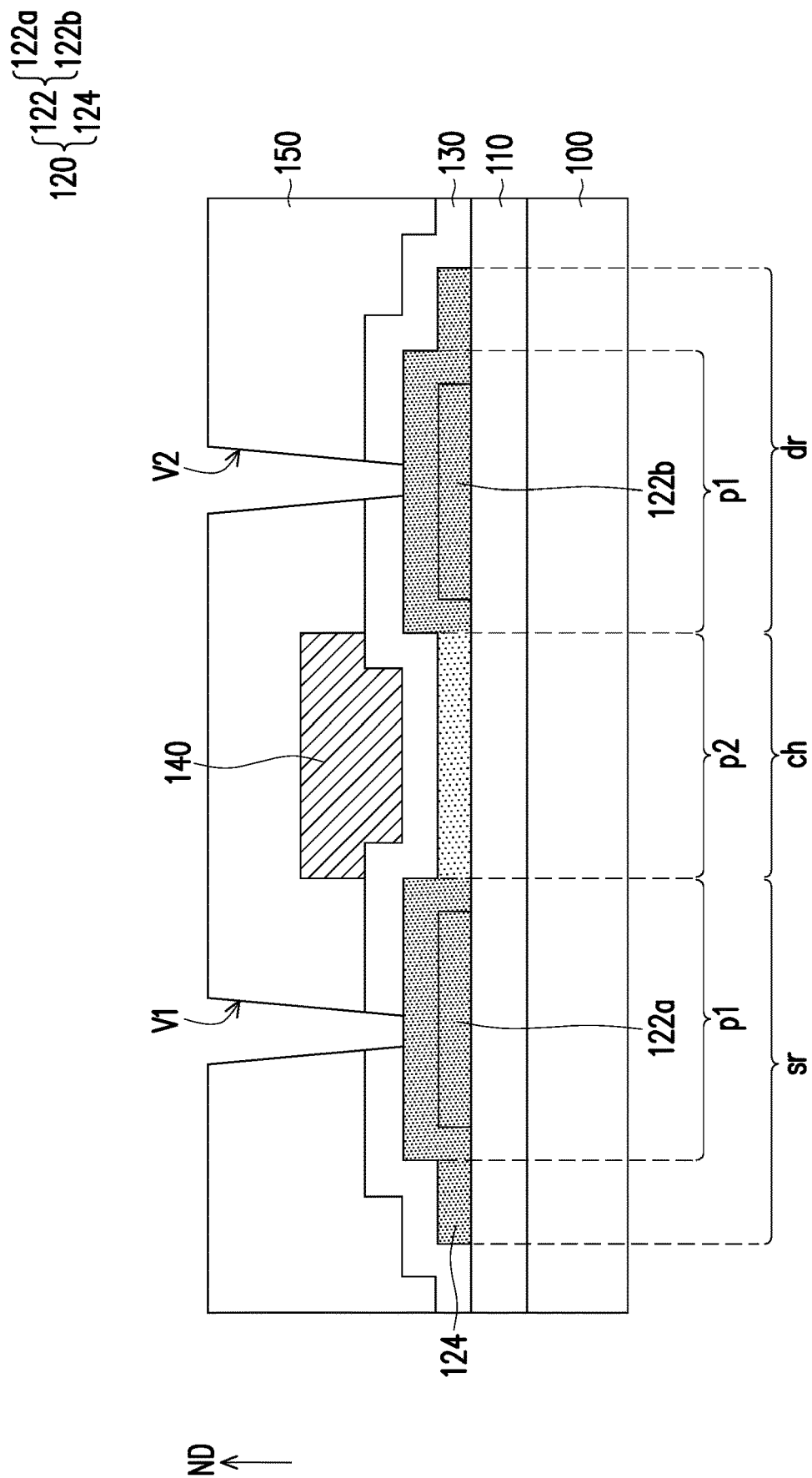

With reference to FIG. 2D, an interlayer dielectric layer 150 is formed on the gate dielectric layer 130 and covers the first gate 140. Through holes V1 and V2 penetrating the interlayer dielectric layer 150 and the gate dielectric layer 130 are formed, and the through holes V1 and V2 are respectively overlapped with the two thick portions p1 in the normal direction ND of the top surface of the substrate 100.

After that, with reference to FIG. 1, a source S and a drain D that are electrically connected to the two thick portions p1 are formed. For instance, a conductive layer 160 may be formed on the interlayer dielectric layer 150 and fills the through holes V1 and V2, so as to be electrically connected to the semiconductor structure 120. The conductive layer 160 may include the source S and the drain D that are electrically connected to the two thick portions p1 through the through holes V1 and V2, respectively.

After the above process, the fabrication of the semiconductor device 1 is substantially completed.

Figure 3:
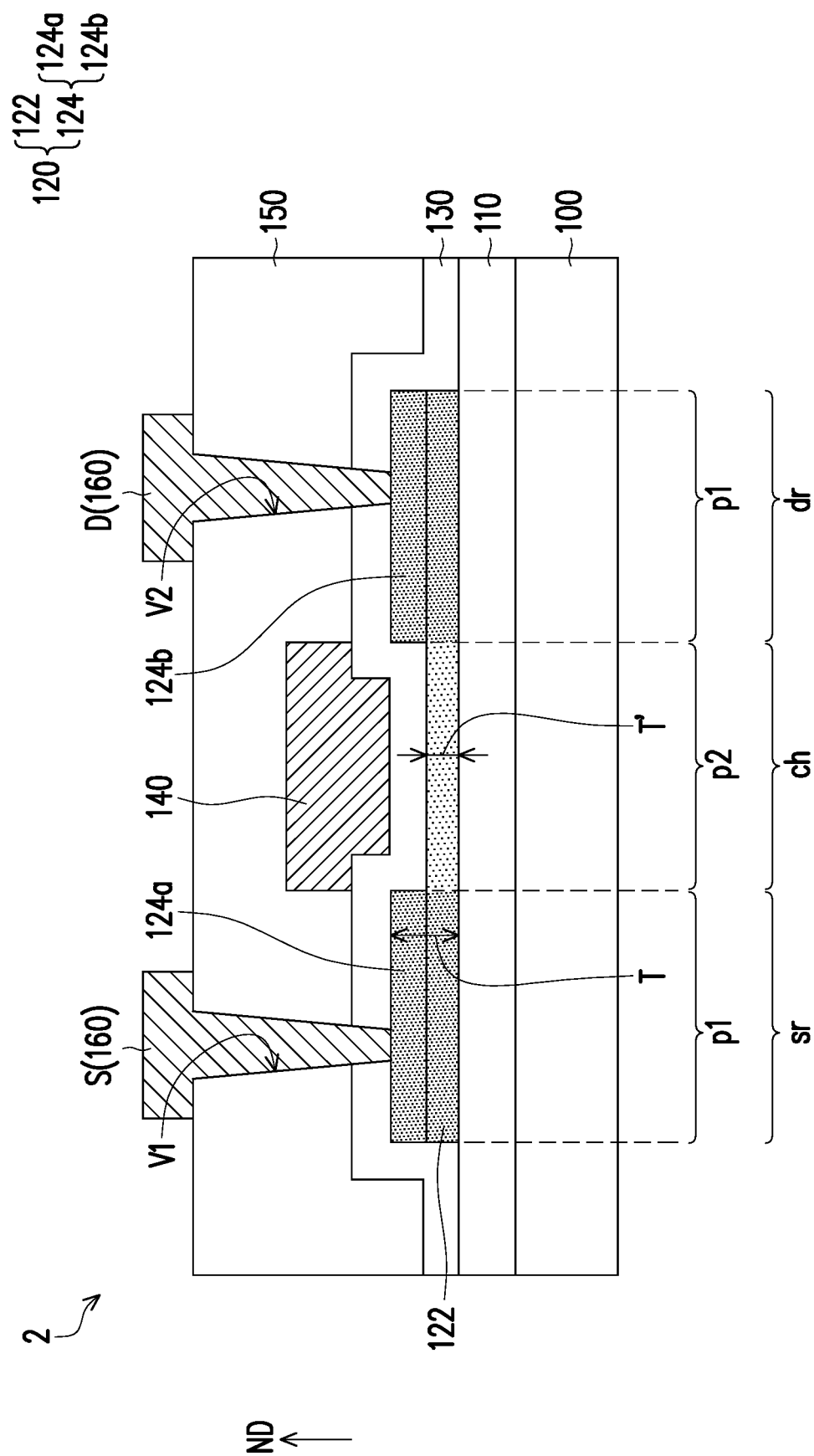
FIG. 3 is a schematic cross-sectional view of a semiconductor device according to another embodiment of the disclosure.

FIG. 3 is a schematic cross-sectional view of a semiconductor device according to another embodiment of the disclosure. Note that the reference numbers and some contents provided in the embodiment depicted in FIG. 1 are used in the embodiment depicted in FIG. 3, where the same or similar numbers are applied to denote the same or similar elements, and the description of the same technical content is omitted. The description of the omitted content may be found in the previous embodiment and will not be provided hereinafter.

With reference to FIG. 3, the main difference between a semiconductor device 2 shown in FIG. 3 and the semiconductor device 1 shown in FIG. 1 lies in that the semiconductor structure 120 of the semiconductor device 2 includes a first metal oxide semiconductor layer 122 and a second metal oxide semiconductor layer 124. The second metal oxide semiconductor layer 124 includes a first island structure 124a and a second island structure 124b separated from each other. The first island structure 124a and the first metal oxide semiconductor layer 122 are stacked to form one of the thick portions p1, and the second island structure 124b and the first metal oxide semiconductor layer 122 are stacked to form the other of the thick portions p1. A part of the first metal oxide semiconductor layer 122 between the two thick portions p1 may constitute the thin portion p2. Namely, a thickness T of the two thick portions p1 of the semiconductor structure 120 is substantially the sum of a thickness of the first metal oxide semiconductor layer 122 and a thickness of the second metal oxide semiconductor layer 124, and a thickness T' of the thin portion p2 is substantially equal to the thickness of the first metal oxide semiconductor layer 122.

Figure 4A:
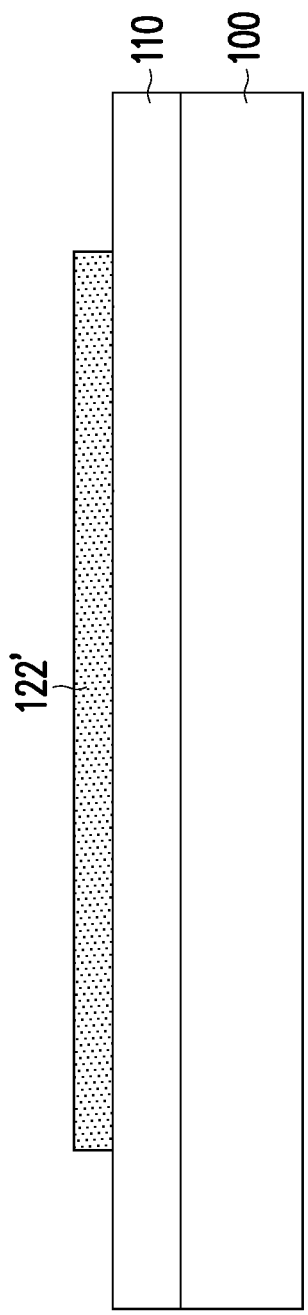
FIG. 4A to FIG. 4C are schematic cross-sectional flowcharts of a manufacturing process according to the embodiment depicted in FIG. 3.
Figure 4B:
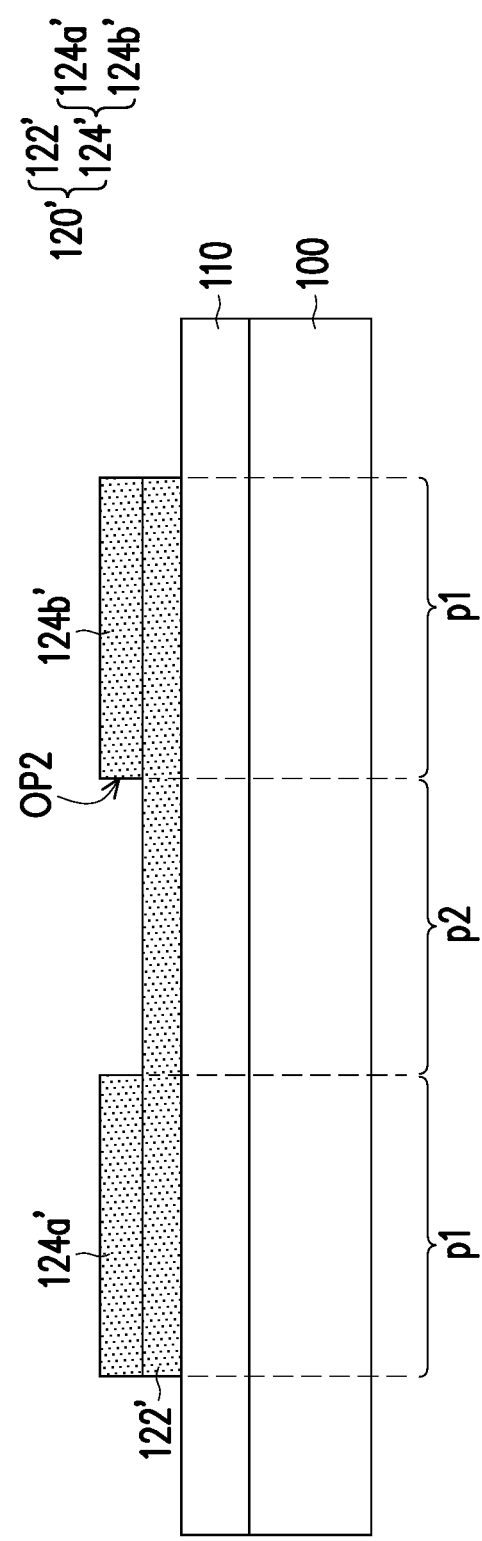
Figure 4C:
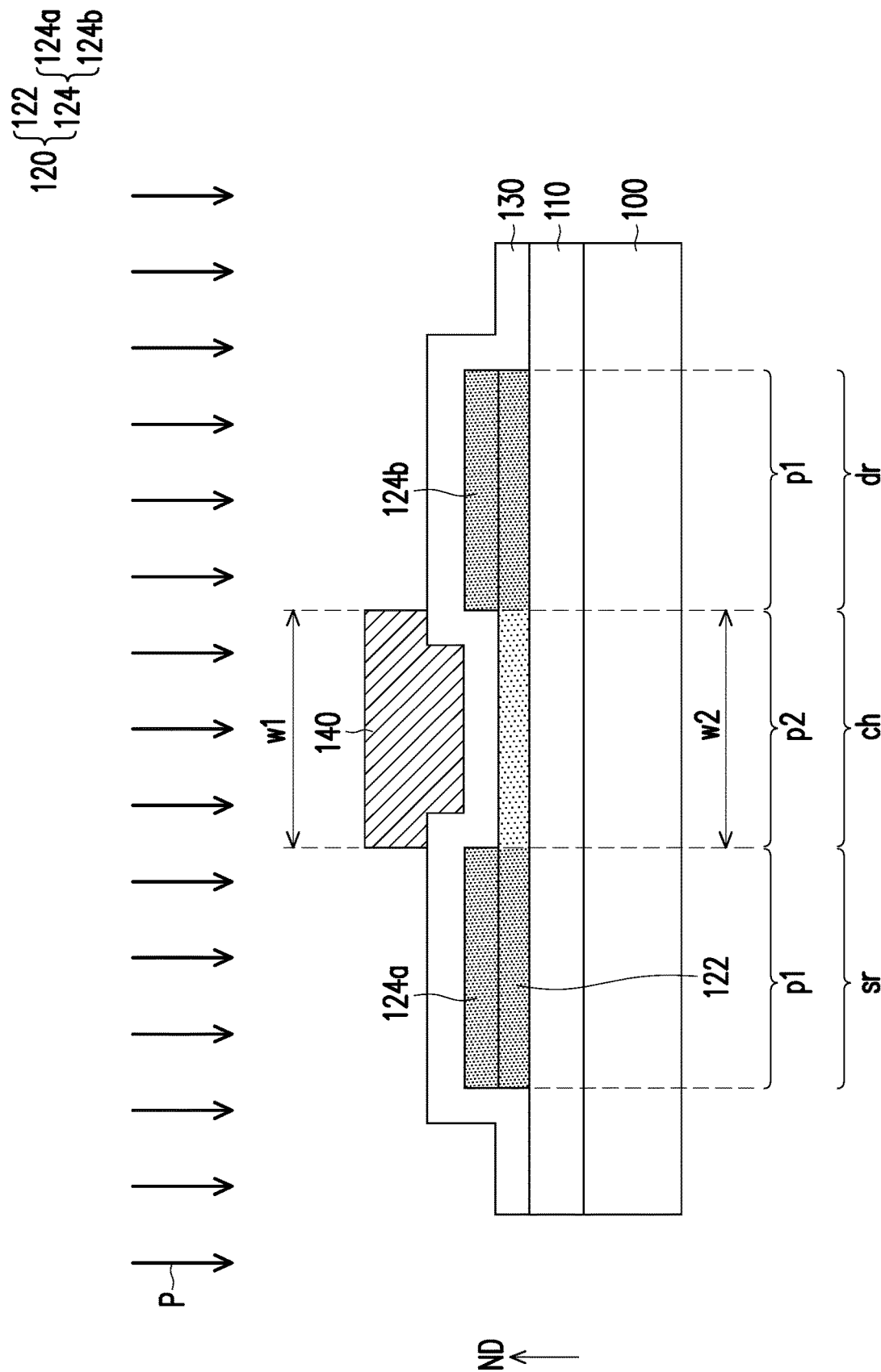

FIG. 4A to FIG. 4C are schematic cross-sectional flowcharts of a manufacturing process according to the embodiment depicted in FIG. 3.

With reference to FIG. 4A and FIG. 4B, a substrate 100 is provided, and a semiconductor structure 120' is formed above the substrate 100. For instance, a buffer layer 110 may be formed on the substrate 100 first, and the semiconductor structure 120' is formed on the buffer layer 110. A method of forming the semiconductor structure 120' may, for instance, include forming a first metal oxide semiconductor layer 122' on the buffer layer 110 and above the substrate 100, as shown in FIG. 4A. After that, as shown in FIG. 4B, a second metal oxide semiconductor layer 124' is formed on the first metal oxide semiconductor layer 122', and the second metal oxide semiconductor layer 124' has a second opening OP2, so that the second metal oxide semiconductor layer 124' includes a first island structure 124a' and a second island structure 124b' separated from each other and exposes one part of the first metal oxide semiconductor layer 122' As such, the one part of the first metal oxide semiconductor layer 122' exposed by the second metal oxide semiconductor layer 124' may constitute the thin portion p2 of the semiconductor structure 120', the first island structure 124a' and another part of the first metal oxide semiconductor layer 122' covered by the first island structure 124a' may constitute one of the two thick portions p1 of the semiconductor structure 120', and the second island structure 124b' and the other part of the first metal oxide semiconductor layer 122' covered by the second island structure 124b' may constitute the other of the two thick portions p1 of the semiconductor structure 120'.

With reference to FIG. 4C, a gate dielectric layer 130 is formed on the semiconductor structure 120. The gate dielectric layer 130 may cover a top surface and sidewalls of the semiconductor structure 120. A first gate 140 is formed on the gate dielectric layer 130. A method of forming the first gate 140 may, for instance, include depositing a gate material layer (not shown) on the gate dielectric layer 130 and performing an etching process to form the first gate 140. A width w1 of the first gate 140 is substantially smaller than or equal to a width w2 of the thin portion p2, and the first gate 140 is overlapped with the thin portion p2 in a normal direction ND of a top surface of the substrate 100 but is not overlapped with the two thick portions p1.

As shown in FIG. 4C, a doping process P is performed on the semiconductor structure 120' by applying the first gate 140 as a mask, so as to form the semiconductor structure 120 including a channel region ch, a source region sr, and a drain region dr, and a doping concentration of the two thick portions p1 is higher than a doping concentration of at least a part of the thin portion p2 between the two thick portions p1. The doping process P may refer to a hydrogen plasma process, for instance, which should however not be construed as a limitation in the disclosure. In this embodiment, the first gate 140 is aligned to the thin portion p2, and therefore the channel region ch includes the entire thin portion p2 between the two thick portions p1. In other embodiments, the width w1 of the first gate 140 is smaller than the width w2 of the thin portion p2 between the two thick portions p1, and therefore the source region sr and the drain region dr extend from the thick portions p1 to the thin portion p2 between the two thick portions p1. As such, the source region sr and the drain region dr include a part of the thin portion p2 between the two thick portions p1.

With reference to FIG. 3, an interlayer dielectric layer 150 is formed on the gate dielectric layer 130 and covers the first gate 140. After that, through holes V1 and V2 penetrating the interlayer dielectric layer 150 and the gate dielectric layer 130 are formed, and the through holes V1 and V2 are respectively overlapped with the two thick portions p1 in the normal direction ND of the top surface of the substrate 100. A conductive layer 160 is then formed on the interlayer dielectric layer 150 and respectively fills the through holes V1 and V2, so as to be electrically connected to the semiconductor structure 120. The conductive layer 160 may include a source S and a drain D that are electrically connected to the two thick portions p1 through the through holes V1 and V2, respectively.

After the above process, the fabrication of the semiconductor device 2 is substantially completed.

Figure 5:
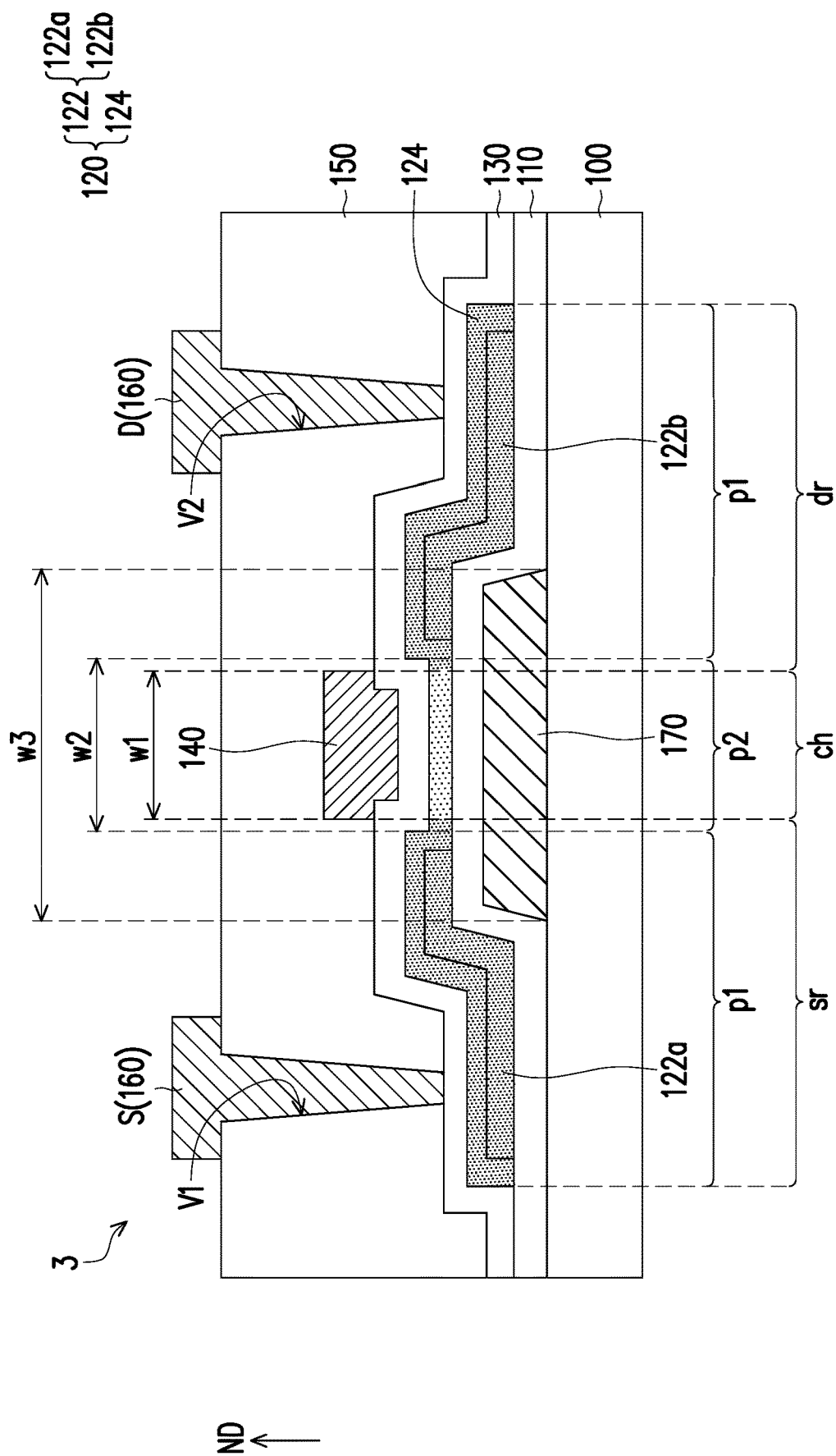
FIG. 5 is a schematic cross-sectional view of a semiconductor device according to still another embodiment of the disclosure.

FIG. 5 is a schematic cross-sectional view of a semiconductor device according to still another embodiment of the disclosure. Note that the reference numbers and some contents provided in the embodiment depicted in FIG. 1 are used in the embodiment depicted in FIG. 5, where the same or similar numbers are applied to denote the same or similar elements, and the description of the same technical content is omitted. The description of the omitted content may be found in the previous embodiment and will not be provided hereinafter.

With reference to FIG. 5, the main difference between a semiconductor device 3 shown in FIG. 5 and the semiconductor device 1 shown in FIG. 1 lies in that the semiconductor device 3 is a dual-gate transistor and further includes a second gate 170. The second gate 170 may be disposed between the substrate 100 and the semiconductor structure 120. For instance, the second gate 170 is disposed between the substrate 100 and the buffer layer 110. The first island structure 122a and the second island structure 122b may be partially overlapped with the second gate 170 in a normal direction ND of a top surface of the substrate 100, respectively. In some embodiments, the first gate 140, the thin portion p2, and the second gate 170 are overlapped in the normal direction ND of the top surface of the substrate 100, where a width w3 of the second gate 170 is larger than a width w1 of the first gate 140 and larger than a width w2 of the thin portion p2, and the width w2 of the thin portion p2 is larger than the width w1 of the first gate 140. Since the width w1 of the first gate 140 is smaller than the width w2 of the thin portion p2, the source region sr and the drain region dr close to the cannel region ch may have different resistivities. Thereby, the resistivity of the semiconductor structure 120 gradually decreases away from the channel region ch. Specifically, the source region sr and the drain region dr respectively include the thick portions p1 and a part of the thin portion p2 close to the thick portions p1. Since a thickness of the two thick portions p1 is larger than a thickness of the thin portion p2, in the source region sr and the drain region dr, the resistivity of the thick portions p1 is smaller than the resistivity of the thin portion p2, whereby hot-carrier effects generated by a lateral electric field in the semiconductor device 120 may be alleviated, and reliability of the semiconductor device 3 may be enhanced.

Figure 6C:
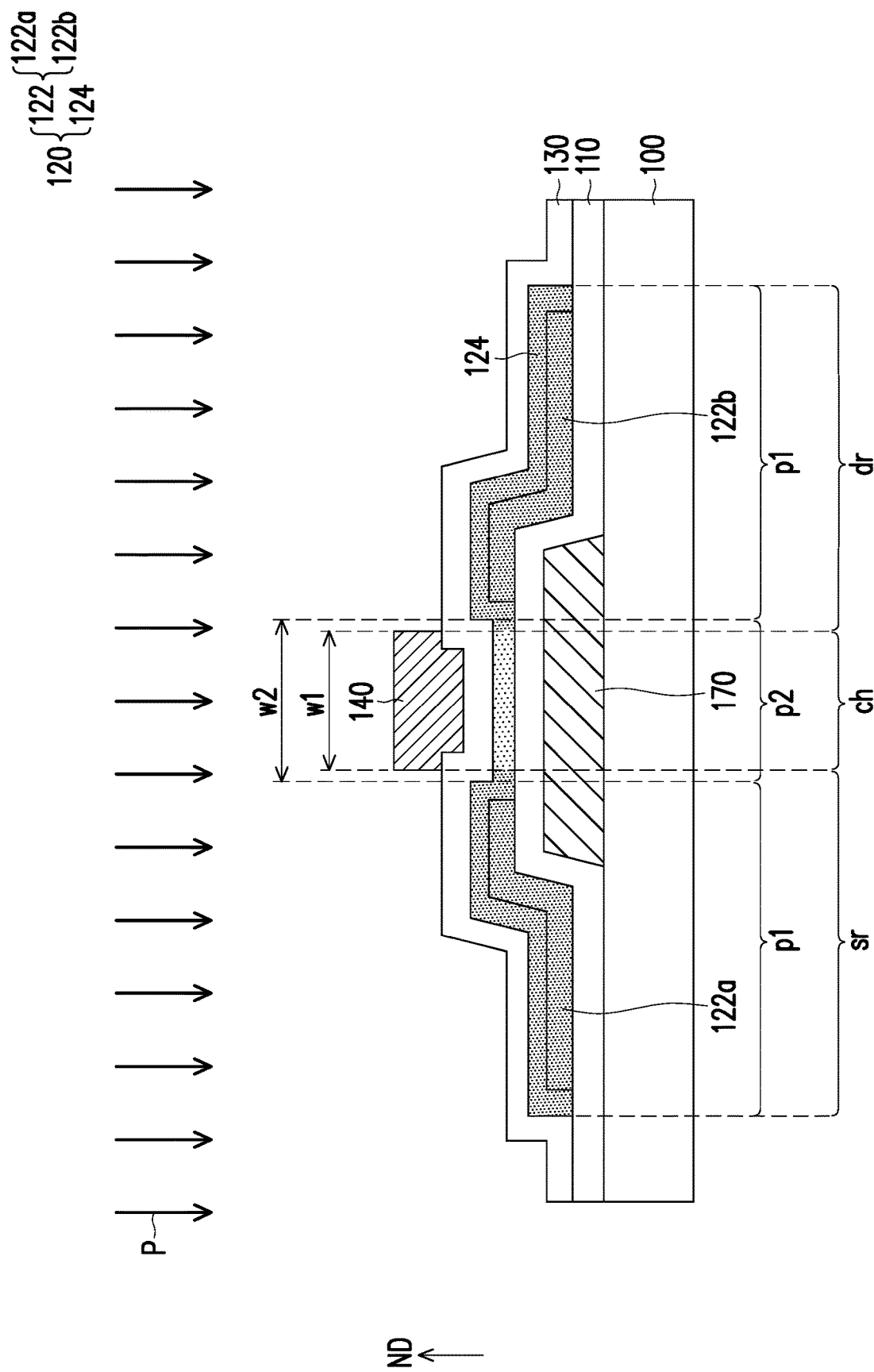

FIG. 6A to FIG. 6C are schematic cross-sectional flowcharts of a manufacturing process according to the embodiment depicted in FIG. 5.

With reference to FIG. 6A, a substrate 100 is provided, a second gate 170 is formed on the substrate 100, and a buffer layer 110 is formed on the second gate 170 and above the substrate 100 and covers the second gate 170.

With reference to FIG. 6B, a semiconductor structure 120' is formed on the buffer layer 110. For instance, a first metal oxide semiconductor layer 122' may be formed on the buffer layer 110, and the first metal oxide semiconductor layer 122' has a first opening OP1, so that the first metal oxide semiconductor layer 122' includes a first island structure 122a' and a second island structure 122b' separated from each other. A distance d between the first island structure 122a' and the second island structure 122b' may be smaller than a width w3 of the second gate 170. A second metal oxide semiconductor layer 124' is then conformally formed on the first metal oxide semiconductor layer 122' and fills the first opening OP1. Thereby, one part of the second metal oxide semiconductor layer 124 between the first island structure 122a and the second island structure 122b may constitute the thin portion p2 of the semiconductor structure 120, the first island structure 122a and another part of the second metal oxide semiconductor layer 124 covering the first island structure 122a may constitute one of the two thick portions p1 of the semiconductor structure 120, and the second island structure 122b and the other part of the second metal oxide semiconductor layer 124 covering the second island structure 122b may constitute the other of the two thick portions p1 of the semiconductor structure 120.

With reference to FIG. 6C, a gate dielectric layer 130 is formed on the semiconductor structure 120', and the gate dielectric layer 130 may cover a top surface and sidewalls of the semiconductor structure 120'. A first gate 140 is then formed on the gate dielectric layer 130. A method of forming the first gate 140 may, for instance, include depositing a gate material layer (not shown) on the gate dielectric layer 130 and performing an etching process to form the first gate 140. In this embodiment, a width w1 of the first gate 140 is smaller than a width w2 of the thin portion p2, and the first gate 140 is overlapped with the thin portion p2 in a normal direction ND of a top surface of the substrate 100 but is not overlapped with the two thick portions p1.

As shown in FIG. 6C, a doping process P is performed on the semiconductor structure 120' by applying the first gate 140 as a mask, so as to form the semiconductor structure 120 including a channel region ch, a source region sr, and a drain region dr, and a doping concentration of the two thick portions p1 is higher than a doping concentration of at least a part of the thin portion p2 between the two thick portions p1. The doping process P may refer to a hydrogen plasma process, for instance, which should however not be construed as a limitation in the disclosure. Since the width w1 of the first gate 140 is smaller than the width w2 of the thin portion p2, the source region sr and the drain region dr close to the cannel region ch may have different resistivities by performing the doping process.

With reference to FIG. 5, an interlayer dielectric layer 150 is formed on the gate dielectric layer 130 and covers the first gate 140. After that, through holes V1 and V2 penetrating the interlayer dielectric layer 150 and the gate dielectric layer 130 are formed, and the through holes V1 and V2 are respectively overlapped with the two thick portions p1 in the normal direction ND of the top surface of the substrate 100. A conductive layer 160 is then formed on the interlayer dielectric layer 150 and respectively fills the through holes V1 and V2, so as to be electrically connected to the semiconductor structure 120. The conductive layer 160 may include a source S and a drain D that are electrically connected to the two thick portions p1 through the through holes V1 and V2, respectively.

After the above process, the fabrication of the semiconductor device 3 is substantially completed.

Figure 7:
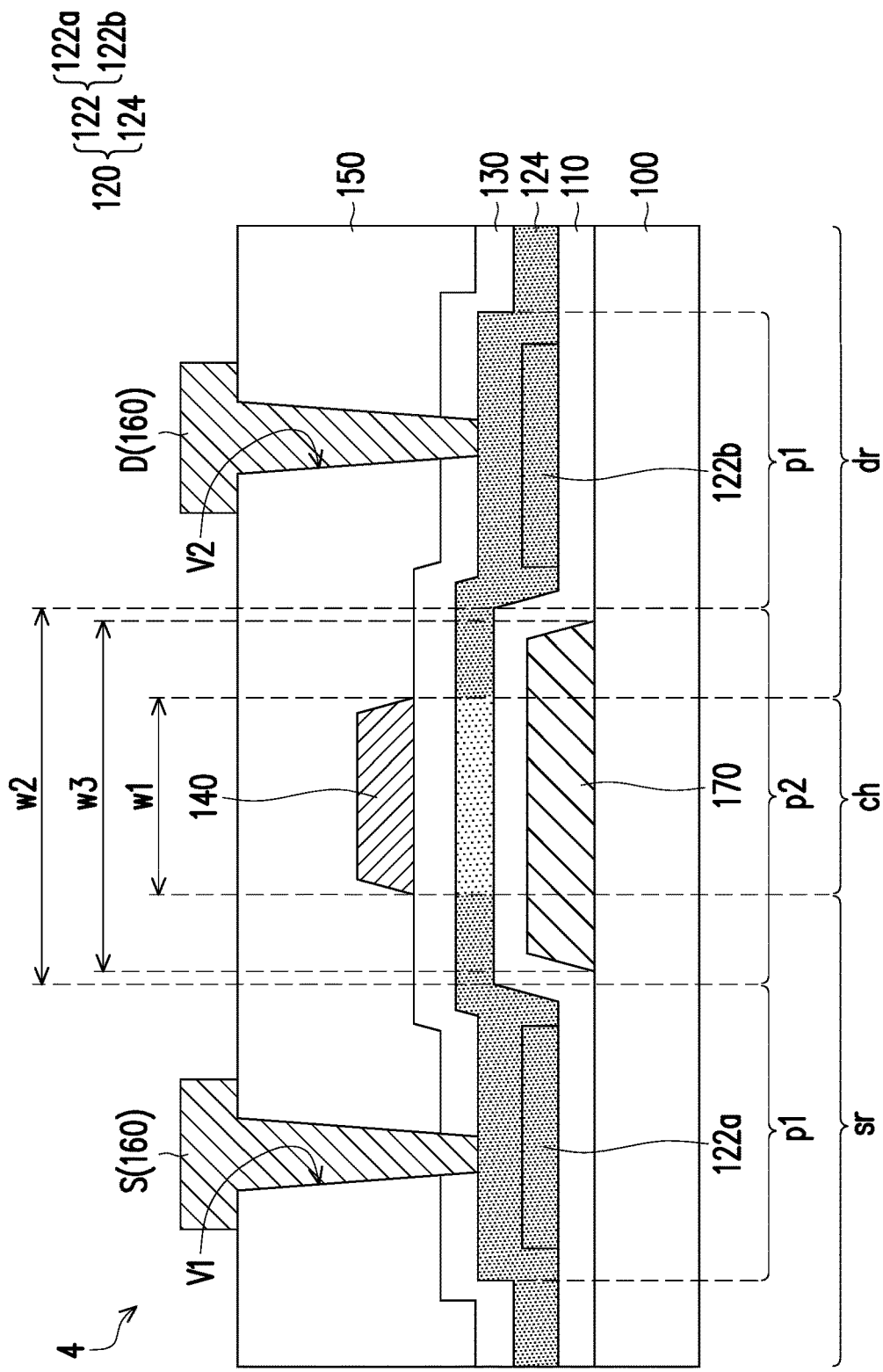
FIG. 7 is a schematic cross-sectional view of a semiconductor device according to still another embodiment of the disclosure.

FIG. 7 is a schematic cross-sectional view of a semiconductor device according to still another embodiment of the disclosure. Note that the reference numbers and some contents provided in the embodiment depicted in FIG. 5 are used in the embodiment depicted in FIG. 7, where the same or similar numbers are applied to denote the same or similar elements, and the description of the same technical content is omitted. The description of the omitted content may be found in the previous embodiment and will not be provided hereinafter.

With reference to FIG. 7, the main difference between a semiconductor device 4 shown in FIG. 7 and the semiconductor device 1 shown in FIG. 1 lies in that the width w3 of the second gate 170 of the semiconductor device 4 is smaller than the width w2 of the thin portion p2, and the first island structure 122a and the second island structure 122b are not overlapped with the second gate 170 in the normal direction ND of the top surface of the substrate 100. The width w2 of the thin portion p2 is larger than the width w3 of the second gate 170, and the thin portion p2 is overlapped with an edge of the second gate 170 in the normal direction ND. Thereby, parasite capacitance between the semiconductor structure 120 and the second gate 170 may be reduced.

Figure 8A:
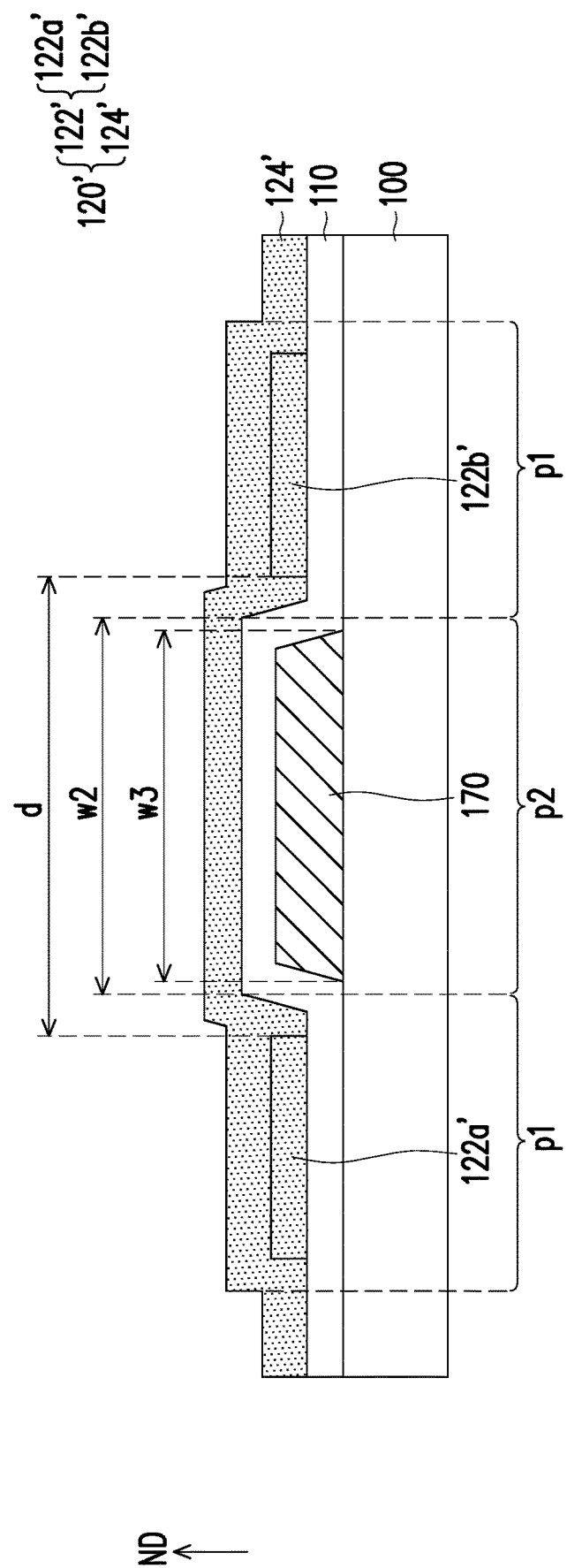
FIG. 8A and FIG. 8B are schematic cross-sectional flowcharts of a manufacturing process according to the embodiment depicted in FIG. 7.
Figure 8B:
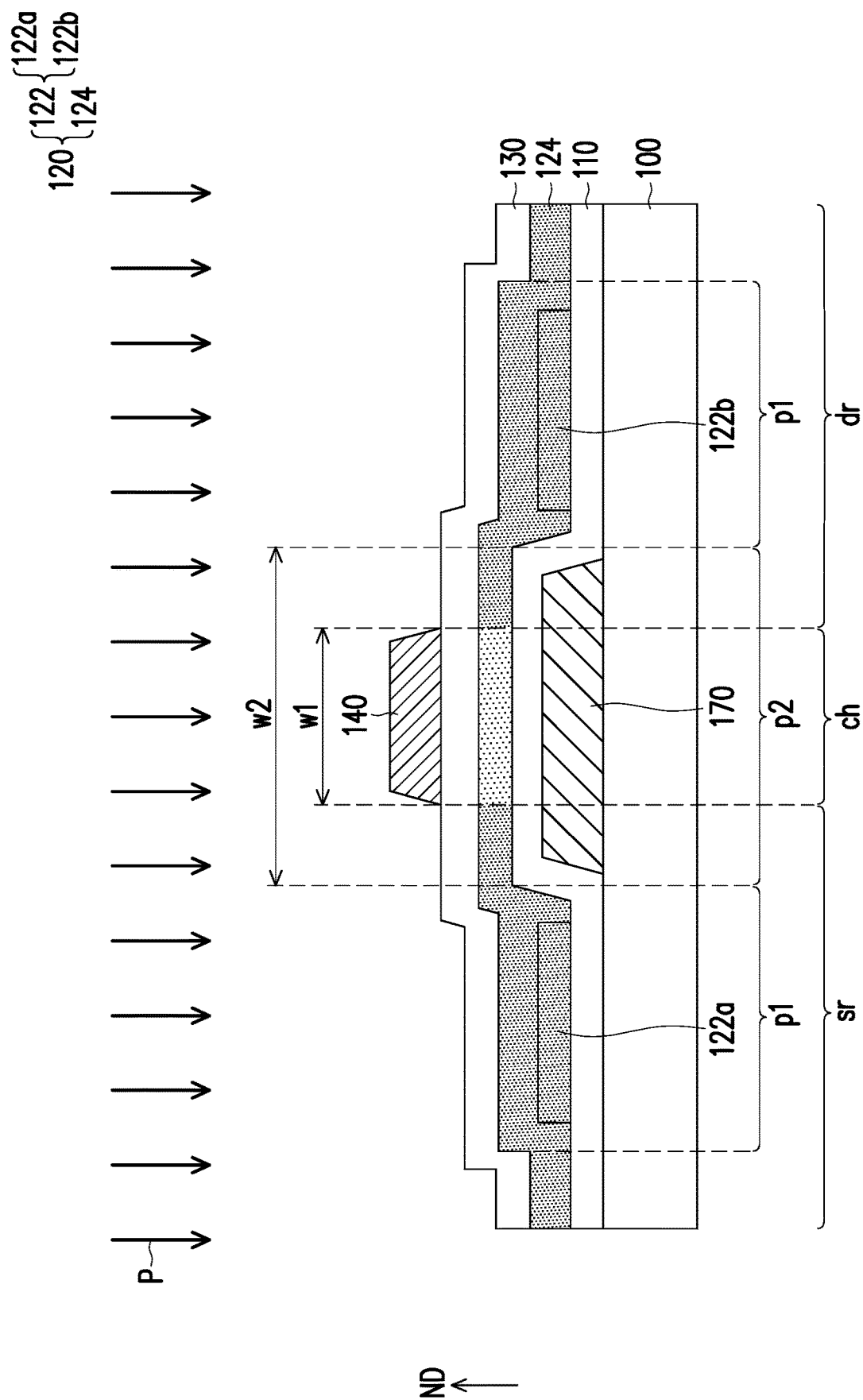

FIG. 8A and FIG. 8B are schematic cross-sectional flowcharts of a manufacturing process according to the embodiment depicted in FIG. 7. Here, FIG. 8A and FIG. 8B may be considered as a schematic cross-sectional view of the manufacturing method of the semiconductor device following the steps depicted in FIG. 6A. The descriptions of the detailed steps depicted in FIG. 6A may be found in the previous embodiment and will not be provided hereinafter.

With reference to FIG. 8A, a semiconductor structure 120' is formed on the buffer layer 110. For instance, a first metal oxide semiconductor layer 122' may be formed on the buffer layer 110, and the first metal oxide semiconductor layer 122' includes a first island structure 122a' and a second island structure 122b' separated from each other. A distance d between the first island structure 122a' and the second island structure 122b' may be larger than a width w3 of the second gate 170, so that the first island structure 122a' and the second island structure 122b' are not overlapped with the second gate 170 in a normal direction ND of a top surface of the substrate 100. A second metal oxide semiconductor layer 124' is then conformally formed on the first metal oxide semiconductor layer 122' and the buffer layer 110. Thereby, one part of the second metal oxide semiconductor layer 124' between the first island structure 122a' and the second island structure 122b' may constitute the thin portion p2 of the semiconductor structure 120', the first island structure 122a' and another part of the second metal oxide semiconductor layer 124' covering the first island structure 122a' may constitute one of the two thick portions p1 of the semiconductor structure 120', and the second island structure 122b' and the other part of the second metal oxide semiconductor layer 124' covering the second island structure 122b' may constitute the other of the two thick portions p1 of the semiconductor structure 120'.

With reference to FIG. 8B, a gate dielectric layer 130 is formed on the semiconductor structure 120'. A first gate 140 is formed on the gate dielectric layer 130. A method of forming the first gate 140 may, for instance, include depositing a gate material layer (not shown) on the gate dielectric layer 130 and performing an etching process to form the first gate 140. In this embodiment, a width w1 of the first gate 140 is smaller than a width w2 of the thin portion p2, and the first gate 140 is overlapped with the thin portion p2 in a normal direction ND of a top surface of the substrate 100 but is not overlapped with the two thick portions p1.

As shown in FIG. 8B, a doping process P is performed on the semiconductor structure 120' by applying the first gate 140 as a mask, so as to form the semiconductor structure 120 including a channel region ch, a source region sr, and a drain region dr, and a doping concentration of the two thick portions p1 is higher than a doping concentration of at least a part of the thin portion p2 between the two thick portions p1. The doping process P may refer to a hydrogen plasma process, for instance, which should however not be construed as a limitation in the disclosure. Since the width w1 of the first gate 140 is smaller than the width w2 of the thin portion p2, the source region sr and the drain region dr close to the cannel region ch may have different resistivities by performing the doping process.

With reference to FIG. 7, an interlayer dielectric layer 150 is formed on the gate dielectric layer 130 and covers the first gate 140. After that, through holes V1 and V2 penetrating the interlayer dielectric layer 150 and the gate dielectric layer 130 are formed, and the through holes V1 and V2 are respectively overlapped with the two thick portions p1 in the normal direction ND of the top surface of the substrate 100. A conductive layer 160 is then formed on the interlayer dielectric layer 150 and respectively fills the through holes V1 and V2, so as to be electrically connected to the semiconductor structure 120. The conductive layer 160 may include a source S and a drain D that are electrically connected to the two thick portions p1 through the through holes V1 and V2, respectively.

After the above process, the fabrication of the semiconductor device 4 is substantially completed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
   a substrate;
   a semiconductor structure, disposed above the substrate and comprising two thick portions and a thin portion located between the two thick portions, wherein a thickness of the two thick portions is larger than a thickness of the thin portion;
   a gate dielectric layer, disposed on the semiconductor structure; and
   a first gate, disposed on the gate dielectric layer, wherein a width of the first gate is smaller than or equal to a width of the thin portion, and the first gate is overlapped with the thin portion in a normal direction of a top surface of the substrate,
   wherein a doping concentration of the two thick portions is higher than a doping concentration of at least a part of the thin portion.

2. The semiconductor device according to claim 1, wherein the semiconductor structure comprises a first metal oxide semiconductor layer and a second metal oxide semiconductor layer, the first metal oxide semiconductor layer is located between the substrate and the second metal oxide semiconductor layer, the first metal oxide semiconductor layer and the second metal oxide semiconductor layer are stacked, and the stacked part of the first metal oxide semiconductor layer and the second metal oxide semiconductor layer forms the two thick portions.

3. The semiconductor device according to claim 2, wherein:
   the second metal oxide semiconductor layer comprises a first island structure and a second island structure separated from each other,
   the first island structure and the first metal oxide semiconductor layer are stacked to form one of the thick portions, the second island structure and the first metal oxide semiconductor layer are stacked to form the other of the thick portions, and
   the thin portion comprises a part of the first metal oxide semiconductor layer between the two thick portions.

4. The semiconductor device according to claim 2, wherein:
   the first metal oxide semiconductor layer comprises a first island structure and a second island structure separated from each other,
   the first island structure and the first metal oxide semiconductor layer are stacked to form one of the thick portions, and the second island structure and the first metal oxide semiconductor layer are stacked to form the other of the thick portions, and
   the thin portion comprises a part of the second metal oxide semiconductor layer between the two thick portions.

5. The semiconductor device according to claim 1, wherein the first gate is not overlapped with the two thick portions in the normal direction of the top surface of the substrate.

6. The semiconductor device according to claim 1, wherein an equivalent resistivity of the two thick portions is smaller than an equivalent resistivity of the thin portion.

7. The semiconductor device according to claim 1, wherein the doping concentration of the two thick portions is a uniform doping concentration.

8. The semiconductor device according to claim 1, further comprising:
a source and a drain, respectively electrically connected to the two thick portions, wherein a projection area of the two thick portions on the substrate is larger than a contact area between the source and the drain and the two thick portions.

9. The semiconductor device according to claim 1, further comprising:
a second gate, disposed between the substrate and the semiconductor structure, wherein a width of the second gate is larger than the width of the first gate but smaller than the width of the thin portion.

10. A manufacturing method of a semiconductor device, comprising:
providing a substrate;
forming a semiconductor structure above the substrate, wherein the semiconductor structure comprises two thick portions and a thin portion located between the two thick portions, and a thickness of the two thick portions is larger than a thickness of the thin portion;
forming a gate dielectric layer on the semiconductor structure;
forming a first gate on the gate dielectric layer, wherein a width of the first gate is smaller than or equal to a width of the thin portion, and the first gate is overlapped with the thin portion in a normal direction of a top surface of the substrate; and
performing a doping process on the semiconductor structure by applying the first gate as a mask, so that a doping concentration of the two thick portions is higher than a doping concentration of at least a part of the thin portion.

11. The manufacturing method according to claim 10, wherein the step of forming the semiconductor structure above the substrate comprises:
forming a first metal oxide semiconductor layer above the substrate, wherein the first metal oxide semiconductor layer comprises a first island structure and a second island structure separated from each other; and
forming a second metal oxide semiconductor layer on the first island structure and the second island structure,
wherein one part of the second metal oxide semiconductor layer between the first island structure and the second island structure constitutes the thin portion, the first island structure and another part of the second metal oxide semiconductor layer covering the first island structure constitute one of the two thick portions, and the second island structure and the other part of the second metal oxide semiconductor layer covering the second island structure constitute the other of the two thick portions.

12. The manufacturing method according to claim 10, wherein the step of forming the semiconductor structure above the substrate comprises:
forming a first metal oxide semiconductor layer above the substrate; and
forming a second metal oxide semiconductor layer on the first metal oxide semiconductor layer, wherein the second metal oxide semiconductor layer comprises a first island structure and a second island structure separated from each other, so as to expose one part of the first metal oxide semiconductor layer,
wherein the one part of the first metal oxide semiconductor layer exposed by the second metal oxide semiconductor layer constitutes the thin portion, the first island structure and another part of the first metal oxide semiconductor layer covered by the first island structure constitute one of the two thick portions, and the second island structure and the other part of the first metal oxide semiconductor layer covered by the second island structure constitute the other of the two thick portions.

13. The manufacturing method according to claim 10, further comprising:
before forming the semiconductor structure above the substrate, forming a second gate on the substrate, wherein a width of the second gate is larger than the width of the first gate and larger than the width of the thin portion.

14. The manufacturing method according to claim 10, further comprising:
forming a source and a drain respectively electrically connected to the two thick portions, wherein a projection area of the two thick portions on the substrate is larger than a contact area between the source and the drain and the two thick portions.

15. A semiconductor device, comprising:
a substrate;
a semiconductor structure, disposed above the substrate and comprising two thick portions and a thin portion located between the two thick portions, wherein a thickness of the two thick portions is larger than a thickness of the thin portion;
a gate dielectric layer, disposed on the semiconductor structure; and
a first gate, disposed on the gate dielectric layer, wherein a width of the first gate is smaller than or equal to a width of the thin portion, and the first gate is overlapped with the thin portion in a normal direction of a top surface of the substrate,
wherein an oxygen concentration of the two thick portions is lower than an oxygen concentration of at least a part of the thin portion.

16. A semiconductor device, comprising:
a substrate;
a semiconductor structure, disposed above the substrate and comprising two thick portions and a thin portion located between the two thick portions, wherein a thickness of the two thick portions is larger than a thickness of the thin portion;
a gate dielectric layer, disposed on the semiconductor structure; and
a first gate, disposed on the gate dielectric layer, wherein a width of the first gate is smaller than or equal to a width of the thin portion, and the first gate is overlapped with the thin portion in a normal direction of a top surface of the substrate,
wherein an equivalent resistivity of the two thick portions is smaller than an equivalent resistivity of at least a part of the thin portion.

* * * * *